United States Patent [19]
Ziklik et al.

[11] Patent Number: 5,402,014
[45] Date of Patent: Mar. 28, 1995

[54] PERIPHERAL PORT WITH VOLATILE AND NON-VOLATILE CONFIGURATION

[75] Inventors: Arye Ziklik, Sunnyvale; Alexander Shubat, Fremont; Yoram Cedar, Cupertino; John H. Pasternak, Fremont, all of Calif.

[73] Assignee: WaferScale Integration, Inc., Fremont, Calif.

[21] Appl. No.: 91,795

[22] Filed: Jul. 14, 1993

[51] Int. Cl.$^6$ ............................................. H03K 19/173
[52] U.S. Cl. ................................. 326/37; 365/189.08; 327/407
[58] Field of Search .................. 307/465, 465.1, 243; 365/189.08, 243

[56] References Cited

U.S. PATENT DOCUMENTS

| | | | |
|---|---|---|---|
| 4,124,899 | 11/1978 | Birkner et al. | 364/716 |
| 4,642,487 | 2/1987 | Carter | 307/465 |
| 4,717,912 | 1/1988 | Harvey et al. | 307/465 |
| 4,870,302 | 9/1989 | Freeman | 307/465 |
| 5,136,188 | 8/1992 | Ha et al. | 307/465 |

OTHER PUBLICATIONS

*Programmable Peripherals Design and Applications Handbook*, WaferScale Integrations, Inc., 1991.
Shubat, et al., A Family of User-Programmable Peripherals with a Functional Unit Architecture, IEEE Journal of Solid-State Circuits, vol. 27, No. 4, Apr., 1992, pp. 515-529.
*PAL Device Data Book*, Advanced Micro Devices, 1990, pp. 2-237 to 2-264.

Primary Examiner—Edward P. Westin
Assistant Examiner—Jon Santamauro
Attorney, Agent, or Firm—Skjerven, Morrill, MacPherson, Franklin & Friel

[57] ABSTRACT

An embodiment of this invention provides an integrated circuit (IC) having a configurable peripheral port which includes an input/output pin, a multiplexer coupled to the input/output pin, volatile configuration bits to control the multiplexer, and non-volatile configuration bits to control the multiplexer and override the volatile configuration bits. One embodiment of an IC also includes a peripheral port as above and functional units, such as programmable array logic (PAL) and erasable programmable read only memory (EPROM), coupled to the multiplexer. In another embodiment, a non-volatile configuration bit from a functional unit configures an input/output pin when the configuration bit is not needed by the functional unit.

10 Claims, 5 Drawing Sheets

PERIPHERAL PORT WITH VOLATILE AND NON-VOLATILE CONFIGURATION

BACKGROUND OF THE INVENTION

1. Field of the Invention

This invention relates to configurable input/output ports used in peripheral devices, and in particular to input/output ports configured with both volatile and non-volatile configuration circuitry.

2. Description of the Related Art

In a typical application of a microcontroller or microprocessor, the microcontroller or microprocessor interfaces with several peripheral devices to accomplish various tasks. Typically, a custom circuit board must be designed to provide the microcontroller or microprocessor with needed interfaces and external services. The number and combination of peripheral devices needed on the circuit board depend on the application.

A Programmable System TM Device ("PSD") manufactured by Wafer Scale Integration, Inc. provides a compact, convenient, and flexible way to provide both interfaces and services in an application of a microcontroller or microprocessor. PSDs are integrated circuits which provide on one die a multiplicity of distinct functional units. For example a PSD may contain a ROM unit, a RAM unit, a programmable array logic (PAL) unit and configurable logic blocks.

Configurable peripheral ports on a PSD connect functional units of the PSD to external devices including, for example, external memory, external logic circuits, microcontrollers, and microprocessors. Using configurable ports and functional units, a PSD can replace many different combinations of peripheral devices. In a particular application, a single PSD chip can provide memory and logic, can serve as "glue" between devices in an application, and can create interfaces between devices operating under different protocols. With nonconfigurable devices, many separate ICs are required to provide the same functions.

Configurable peripheral ports generally include I/O pins, circuitry for routing input or output signals to or from the I/O pins, and configuration circuitry to control the routing. FIG. 1 illustrates an I/O pin 100 from a configurable peripheral port. Typically, several I/O pins, such as I/O pin 100 are grouped together to form a port. An input select multiplexer 103 and an output select multiplexer 102 route, in accordance with control signals on bus 105A, the signals that pass through I/O pin 100. As shown in FIG. 1, some typical signals to be routed through output select multiplexer 102, buffer 101 and output from I/O pin 100 include a "Latched address" signal, a "Register-out" signal, and an "Alternate function out" signal. Input signals are routed through I/O pin 100, lead 104, and input select multiplexer 103. Typical input signals include "Alternate Function In," "Status In," and "Address Input". Input select multiplexer 103 routes each input signal to the proper one of lines 103A, 103B, and 103C in accordance with control signals on bus 105A.

Configuration of I/O pin 100 depends on volatile configuration circuitry 106. Volatile configuration circuitry 106 can be, for example, flip-flops, registers, or one or more memory cells from an SRAM or a DRAM. Volatile configuration circuitry 106 retains configuration data (also referred to as configuration bits) while power is applied but loses data when power is off. At start-up, when power is initially applied, I/O pin 100 is typically unusable because configuration data is not correctly set.

After start-up, a microcontroller (not shown) writes configuration data to volatile configuration circuitry 106 using data line 106A, address line 106B, and write line 106C. Volatile configuration circuitry 106 controls, via bus 105A, the signals which pass through multiplexers 102 and 103.

Volatile configuration circuitry 106 also controls the state of buffer 101. In one state, buffer 101 passes output signals from multiplexer 102 to I/O pin 100. In another state, buffer 101 blocks output signals from multiplexer 102, thereby allowing input signals to be driven from I/O pin 100 to input multiplexer 103 via line 104.

Volatile configuration of configurable ports has the advantage of flexibility. A microcontroller changes the configuration of an I/O port simply by writing new configuration data, and a single I/O pin can be switched among several different uses. Using volatile circuitry for configuration also has major disadvantages:

1) the volatile configuration circuitry must be initialized with configuration data before an I/O pin can be used, therefore volatile configuration cannot be used for access that must be usable at start-up; and 2) software errors can write incorrect configuration data to volatile circuitry and disable an I/O pin.

Another type of configuration used in some configurable ports is pin based configuration. With pin based configuration, an external voltage applied to a configuration pin on an IC controls the configuration of one of the IC's I/O ports. For example, a low voltage applied to a configuration pin on some microcontrollers configures an I/O port as a data port, while a high voltage on the configuration pin permits other uses of the I/O port.

Pin based configuration can be practical in simple I/O ports where a single configuration pin configures an entire port. But in many configurable ports, each I/O pin must be individually configurable and requires several configuration bits. If each configuration bit is provided by a separate configuration pin, the number of configuration pins required for complex configurable port is excessive. Accordingly, pin based configuration is impractical for many applications.

Many prior art devices, such as PLDs, use non-volatile circuitry to control the configuration of I/O ports. U.S. Pat. No. 4,124,899 issued Nov. 7, 1978 to Birkener et al., incorporated herein by reference in its entirety, provides details regarding the operation of PLDs. FIG. 2 shows a prior art PLD macrocell 250 with I/O pin 200. A PLD (or a PAL unit in a configurable peripheral) generally contains several PLD macrocells like PLD macrocell 250. By blowing fuses or anti-fuses in a programmable array (not shown) and setting non-volatile configuration circuitry 207A and 207B, a user programs PLD macrocell 250 to perform a desired logic or arithmetic function. Non-volatile configuration circuitry is typically implemented using fuses, antifuses, or one or more cells from ROM, PROM, EPROM, FLASH, or $E^2$PROM.

Signals to be processed by PLD macrocell 250 are fed into the programmable array (not shown) via lines such as 220A and 220B. Signals from the programmable array are routed to a set of AND gates 214, and output signals from the set of AND gates 214 are sent to input leads of an OR gate 210. In general, PLD macrocell 250 could have a programmable array between AND gates 214 and OR gate 210.

An output signal from OR gate 210 is sent to an input lead 213D of flip-flop 213. Flip-flop 213 provides an output signal and an inverted output signal that are registered with a clock signal on lead 213C. The registered output signals are provided on input leads of a multiplexer 212. The output signal from OR gate 210 is also provided to multiplexer 212 directly or inverted through inverter 214. Non-volatile configuration circuitry 207A and 207B select the output signal of multiplexer 212.

A signal on line 205, a product-term signal from the programmable array (not shown), enables or disables inverter 201, typically disabling inverter 201 when I/O pin 200 is used for input. Multiplexer 217 selects the signal which will be fed back to the programmable array through buffer/inverter 218.

Non-volatile configuration circuitry retains configuration data after power-down and provides correct configuration at start-up. Accordingly, non-volatile configuration has the advantage of permitting an I/O port to be used without being initialized by a microprocessor. Correct configuration at start-up is necessary for many I/O functions, such as data buses and PLDs. Another advantage of non-volatile configuration is that configuration can be made immune to software errors which incorrectly change the configuration.

Non-volatile configuration also has disadvantages. Prior art ports with non-volatile configured circuitry are typically dedicated to specific uses and cannot be used with any other functions. Such ports lack flexibility, and are wasted when an application of the peripheral device does not need the dedicated functions. Such ports do not permit a microprocessor to reconfigure the port as needed.

Another problem with prior art configurable I/O ports is the amount of configuration circuitry required. In a complicated I/O port, each I/O pin requires configuration circuitry to provide several configuration bits. The configuration circuitry increases the size and cost of an integrated circuit.

A new type of configurable port is needed which can be configured to connect any of a number of different external devices to any of the different functional units provided on the configurable peripheral device. The ports should provide the flexibility of volatile configuration which is software programmable and should be able to access functional units required at start-up. The ports should efficiently use configuration circuitry to decrease the wafer area needed for fabrication. Greater flexibility would permit more functional units to be addressed with fewer I/O pins, permit tailoring of an integrated circuit to address the needs of customer specific applications, and provide more usable functions at lower cost.

SUMMARY OF THE INVENTION

In accordance with this invention, I/O ports on an integrated circuit (IC) connect a plurality of external devices to any one of a plurality of functional units in the IC. Moreover, in accordance with one embodiment of this invention, a user can configure an I/O pin in a port using non-volatile configuration or can configure the same I/O pin using volatile configuration. The combination of volatile and non-volatile configuration provides greater flexibility and more efficient use of I/O pins and functional units.

In accordance with another embodiment of the invention, a configurable peripheral port includes an input/output pin, a multiplexer coupled to the input/output pin, volatile configuration circuitry to control the multiplexer and configure the port, and non-volatile configuration circuitry to override the volatile configuration circuitry. The configurable port may be configured using the non-volatile configuration bits and thus be used at start-up, or may be configured using the volatile configuration bits and thus be configured during operation.

In accordance with another embodiment of the invention, an IC, such as a configurable peripheral device having an on-chip PAL unit and/or a memory, such as an EPROM, is provided with an I/O pin coupled through a multiplexer to a PLD macrocell of the PAL unit and/or to the memory. Connecting through a multiplexer permits access to other functional units of the IC when the PLD macrocell or memory is not used. I/O pins are used more efficiently than prior art devices which contain ports that can only be used to access the PLD macrocells and/or memories.

Another embodiment includes a configurable peripheral port having an I/O pin coupled through a multiplexer to a data bus, with or without a PAL unit coupled to the multiplexer. When properly configured using non-volatile configuration circuitry, the I/O pin provides access to internal or external memory which is coupled to the data bus. When the configurable peripheral device is used with a microcontroller having a time multiplexed address/data bus, data is transmitted through an address/data port rather than through the configurable port, and the configurable port is available for other uses.

Still another embodiment provides, on an IC, a configurable port connected to a functional unit, such as an EPROM unit, a RAM unit, or a PAL unit. Multi-purpose non-volatile configuration circuitry is provided which controls operation of the functional unit or configures the port. For example, non-volatile circuitry which controls a PLD macrocell in a PAL unit can alternatively control routing of signals through a configurable port when the PLD macrocell is not needed. Multiple use of non-volatile circuitry reduces the silicon area required to fabricate a port and reduces the cost of fabrication.

This invention will be more fully understood in view of the following detailed description taken together with the drawings.

DETAILED DESCRIPTION

Figure 1:
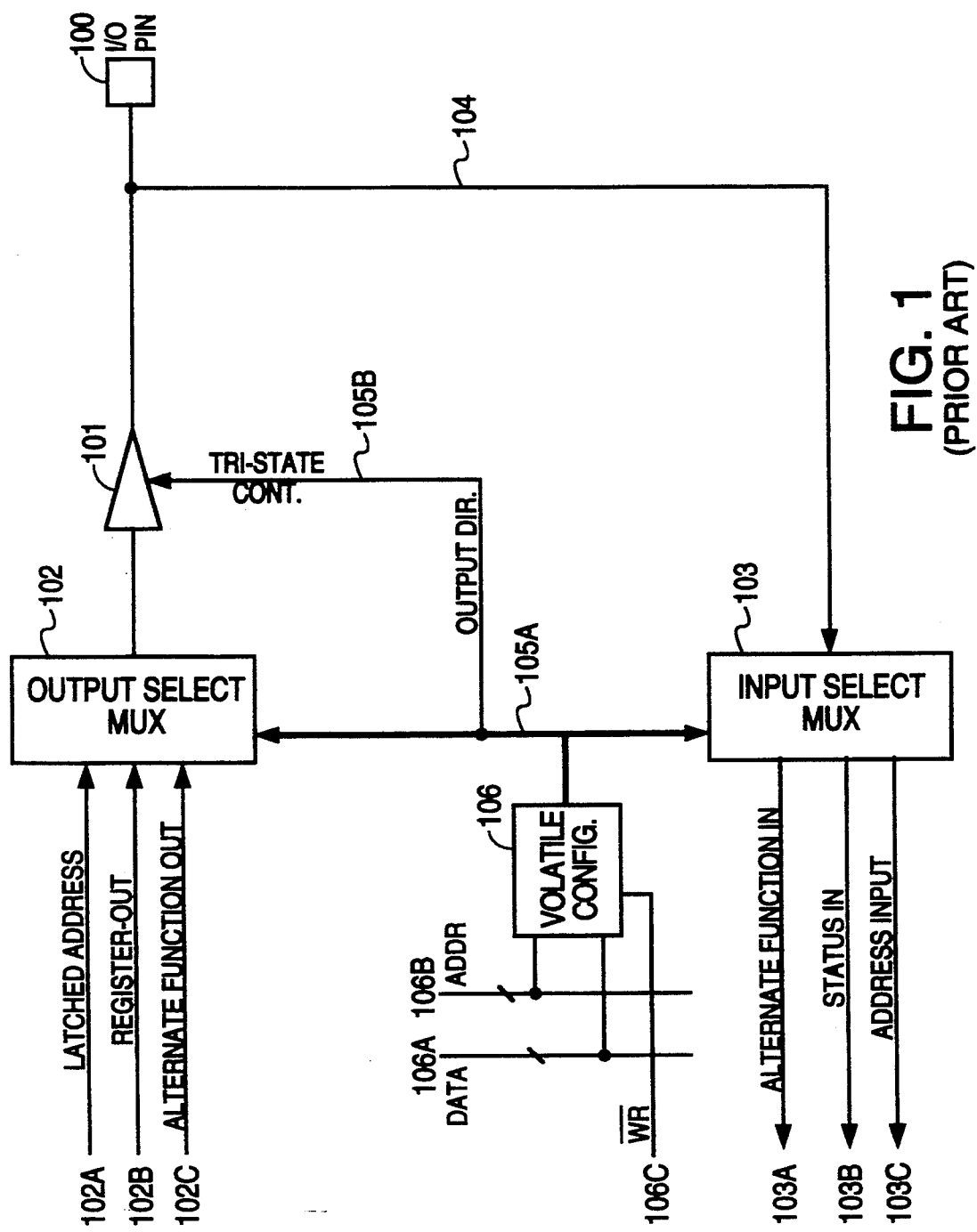
FIG. 1 shows a prior art configurable peripheral port.
Figure 2:
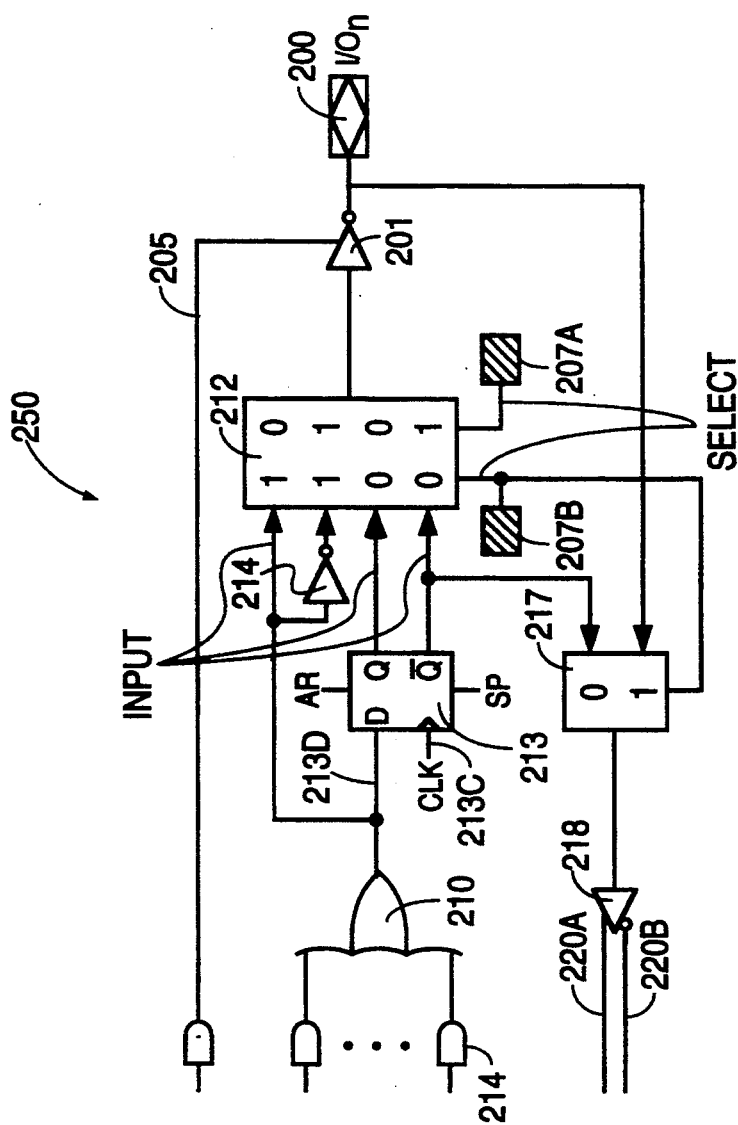
FIG. 2 shows a prior art PLD macrocell.
Figure 3:
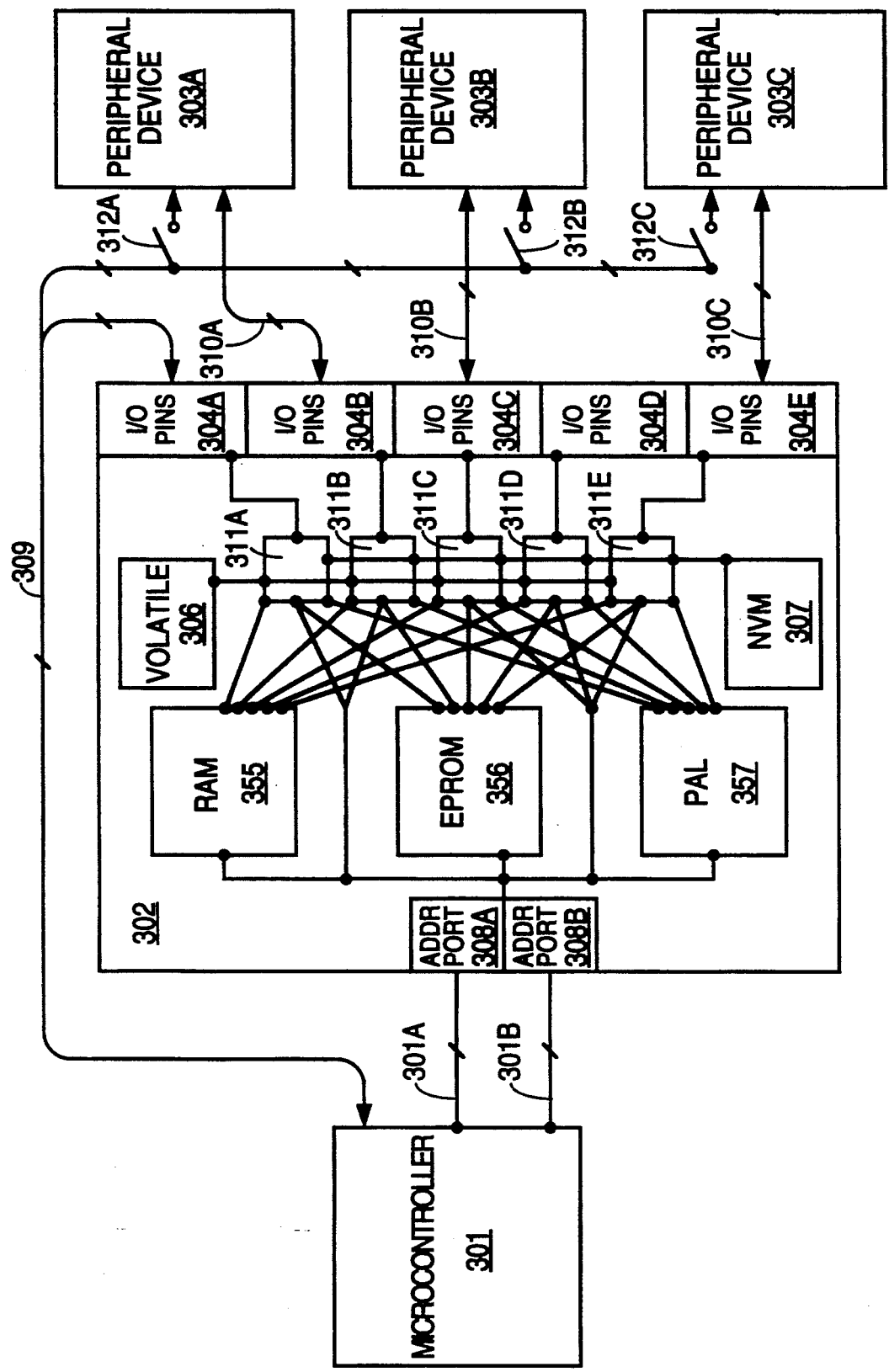
FIG. 3 shows a block diagram of a microcontroller connected to a configurable peripheral device according to one embodiment of the invention.
Figure 4:
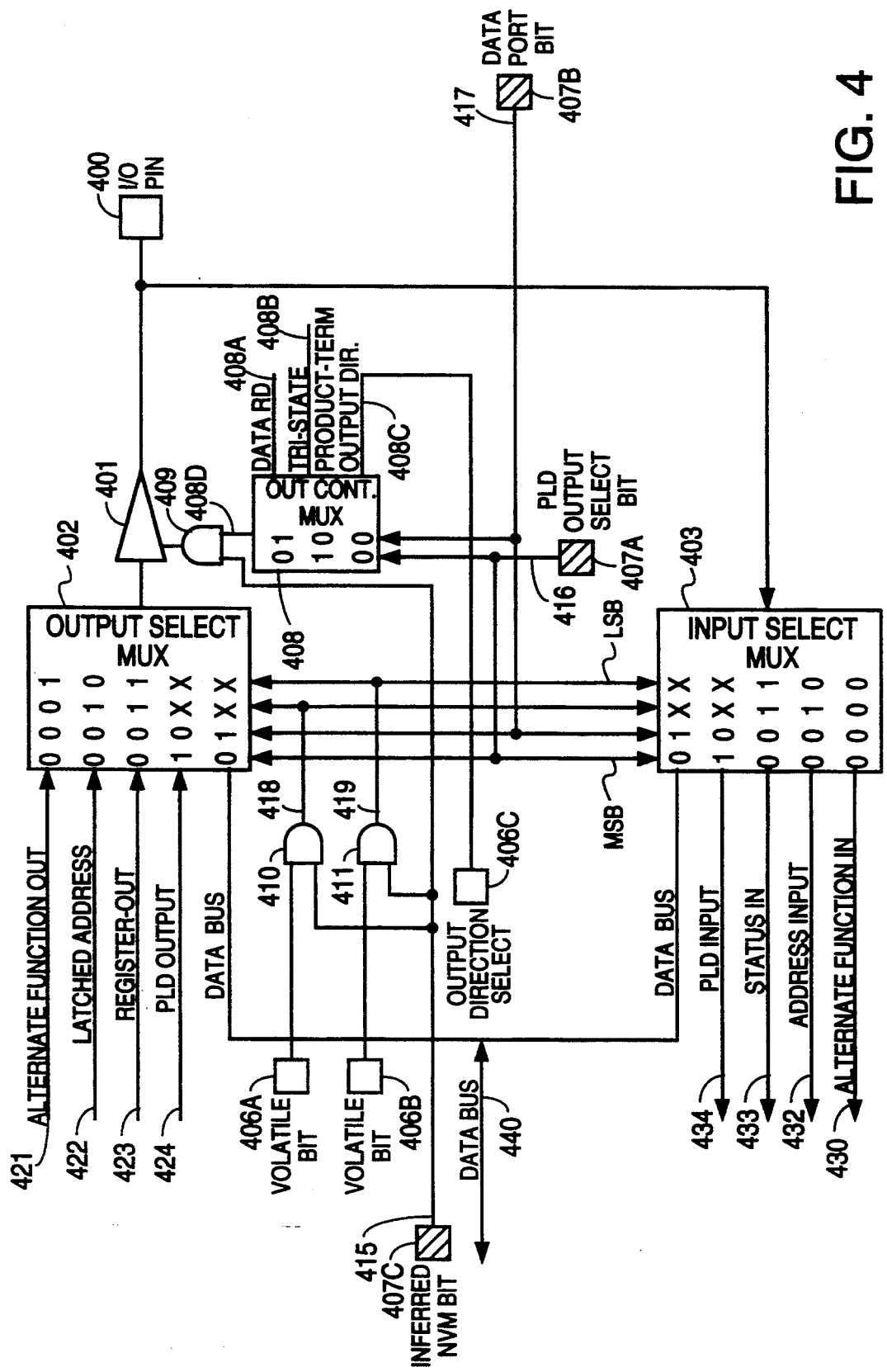
FIG. 4 shows another embodiment of this invention utilizing a configurable port that employs both volatile and non-volatile configuration bits.
Figure 5:
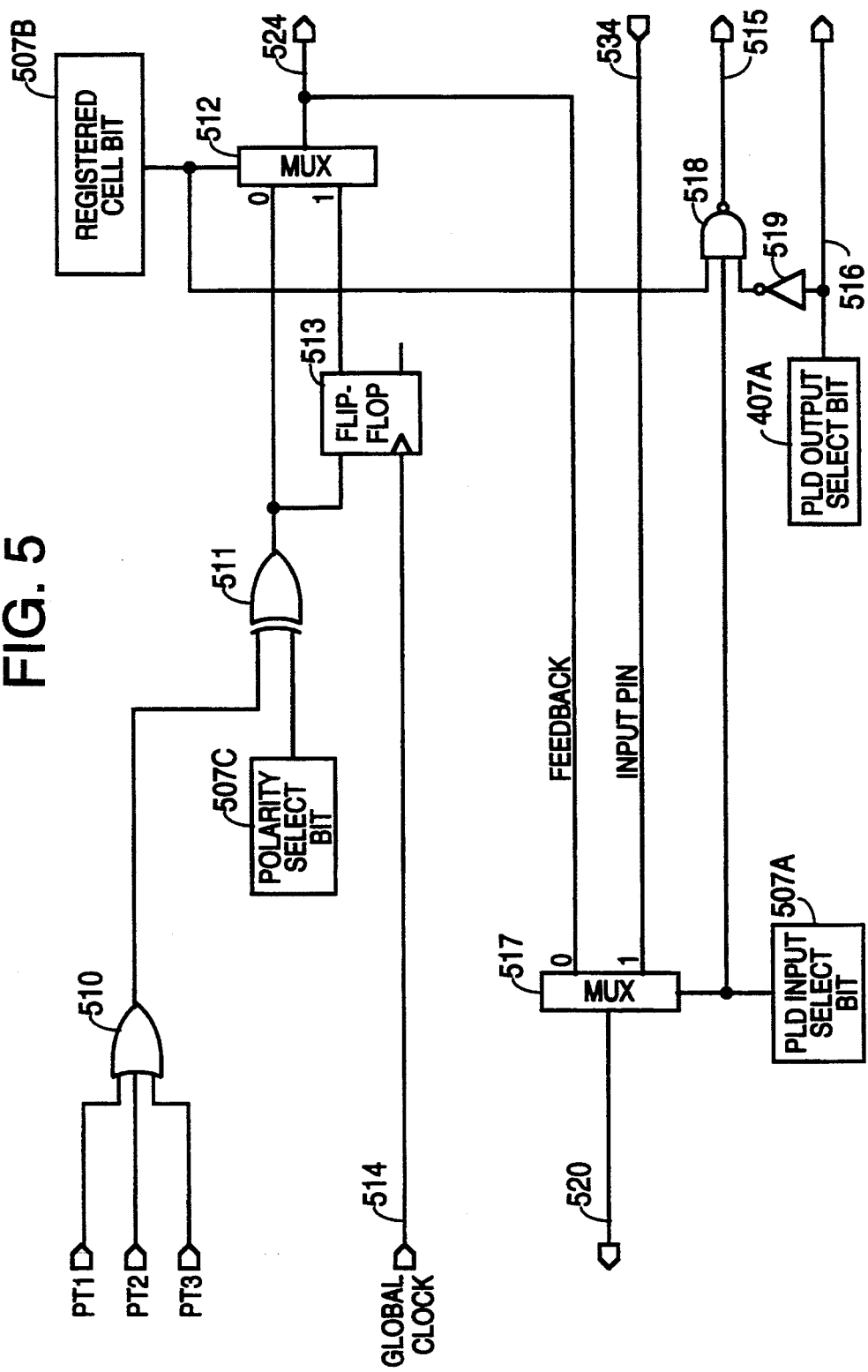
FIG. 5 shows a PLD macrocell and circuitry which recycles non-volatile configuration bits.

Embodiments of this invention are described in conjunction with FIGS. 3, 4, and 5. For convenience, description of the embodiments will be in conjunction with a microcontroller. It should be understood that the term microcontroller as used here includes microprocessors and that configurable peripheral ports in accordance with this invention may also be used with other devices.

Configurable peripherals, such as PSDs, provide convenient structures for creating interfaces between microcontrollers and peripheral devices. FIG. 3 shows a block diagram of a microcontroller 301 and three peripheral devices 303A, 303B, and 303C connected to a configurable peripheral 302 according to an embodiment of the present invention. Configurable peripheral 302 provides sets of input/output (I/O) pins 304A-304E. Each set 304A-304E may be configured to connect any of a wide variety of ICs. In FIG. 3, I/O pins 304A connect to microcontroller 301, and I/O pins 304B, 304C and 304E connect to devices 303A, 303B, and 303C respectively. I/O pins 304D are unused. In other applications of configurable peripheral 302, more than one set of I/O pins 304A-304E may be connected to a single peripheral device.

Devices 303A, 303B, and 303C are each separate ICs, and may provide external memory (such as RAM or ROM), logic, or other appropriate functions. In addition to connecting to configurable peripheral 302, devices 303A, 303B, and 303C may connect directly to each other or to microcontroller 301. The optional connections are indicated by switches 312A, 312B, and 312C. Actual connections of microcontrollers, configurable peripherals, and other peripheral devices depend on the application and are not part of the invention claimed herein. Such connections are known in the art and are exemplified circuits employing PSDs.

Each set 304A-304E contains eight I/O pins and can be configured to provide an eight bit port. Alternatively, any number of I/O pins may be employed.

As a part of the same IC, peripheral 302 has functional units including Random Access Memory (RAM) 355, Erasable Programmable Read Only Memory (EPROM) 356, and a PAL unit 357. Many other functional units can be provided, including interrupt controller units, timer/counters units, watchdog units, and power management units, for example. Functional units 355, 356, 357 of peripheral 302 may be accessed by microcontroller 301 or peripheral devices 303A, 303B, and 303C through one or more I/O pins from the sets 304A-304E. Multiplexing circuitry 311A-311E can connect any I/O pin from the sets 304A-304E to any of the functional units 355, 356, or 357. Alternatively, each set of I/O pins 304A-304E may provide access to only some of the functional units 355, 356, or 357 of configurable peripheral 302.

Two dedicated eight bit address ports 308A and 308B connect to microcontroller 301 through a sixteen bit address bus comprising lines 301A and 301B. Address ports 308A and 308B are dedicated ports, that is ports that are not configurable for other functions. Because most microcontrollers require an address bus that is sixteen bits or larger, two address port will be used in most applications. If an address port larger than sixteen bits is required, one or more I/O pins from the sets 304A-304E can be configured to provide additional address pins.

In many applications, on-board memory in a microcontroller is not large enough for the needs of the application, and additional memory must be provided. To expand memory, many microcontrollers require both an external address bus and an external data bus. Other microcontrollers use time multiplexed address-/data buses which carry both address and data signals. To provide maximum flexibility, no dedicated data port is provided on peripheral 302. If necessary, one or more sets of I/O pins 304A-304E can be configured as data ports. In FIG. 3, set 304A is configured as an eight bit data port that connects to data bus 309. Unlike the prior art, if the set of I/O pins 304A were not needed as a data port, I/O pins 304A would be available for other uses, such as access to PAL unit 357 or other functional units.

Configurable peripheral 302 contains volatile configuration circuitry 306 which may be written to by microcontroller 301. Volatile configuration circuitry 306 connects to multiplexing circuitry 311A-311E and provides volatile configuration bits to configure I/O pins in the sets 304A-304E, each I/O pin being individually configurable. Non-volatile configuration circuitry 307 also connects to multiplexing circuitry 311A-311E and provides non-volatile configuration bits to configure I/O pins 304A-304E. Volatile and non-volatile configuration circuitry 306 an 307 are shown as blocks, but the configuration circuitry may be distributed throughout configurable peripheral 302. The volatile and non-volatile bits control how multiplexing circuitry 311A-311E routes signals to or from I/O pins 304A-304E, the routing of signals to and from each I/O pin in the sets of I/O pins 304A-304E being individually controllable. Multiplexing circuitry 311A-311E permits the non-volatile configuration bits to override volatile configuration bits, so that when the non-volatile configuration circuitry 307 provides specific configuration data microcontroller 301 can not alter the configuration by writing to the volatile configuration circuitry 306.

FIG. 4 shows a circuit diagram containing an I/O pin 400 as part of an eight pin configurable peripheral port according to an embodiment of the invention. I/O pin 400 conducts signals routed to or from a microcontroller or other device connected to I/O pin 400. I/O pin 400 can, for example, be used as one of the pins in the I/O pin sets 304A-304E, shown in FIG. 3.

I/O pin 400 is configured using volatile configuration circuitry 406A, 406B and 406C and non-volatile configuration circuitry 407A, 407B and 407C. Volatile configuration circuitry 406A, 406B and 406C are, for example, flip-flops, registers, or one or more memory cells from an SRAM, or a DRAM. Volatile configuration circuitry 406A, 406B, and 406C lose data when turned off, are easily set or written to, and can be initialized or modified at anytime after start-up using software executed by a microcontroller.

Some functional units must be available at start-up in order for a microcontroller to operate properly. A microcontroller cannot configure ports for access to these functional units because the functional units are needed before the microcontroller is capable of configuring ports. Accordingly, volatile configuration circuitry 406A, 406B, and 406C can not be used to configure a port which provides access to functional units needed by the microcontroller at start-up.

Non-volatile configuration circuitry 407A, 407B, and 407C are typically implemented using fuses, antifuses, or one or more cells from ROM, PROM, EPROM, FLASH, or $E^2PROM$, and provide non-volatile configuration bits that configure I/O pin 400. Methods for making and programming non-volatile circuitry are well known in the art, see for example U.S. Pat. No. 5,042,009 entitled "Method for Programming a Floating Gate Memory Device" by Reza Kazerounian and Boaz Eitan, which is incorporated herein by reference in its entirety. Non-volatile configuration circuitry 407A, 407B, and 407C retains configuration bits after power down and does not need to be initialized at start-up. Accordingly, non-volatile configuration circuitry 407A, 407B, and 407C can be used to configure ports for access to functional units necessary at start-up.

Non-volatile configuration circuitry 407A, 407B, and 407C also can provide protection against software errors because some types of non-volatile configuration circuitry cannot be changed by a microcontroller. Non-volatile configuration data is programmed into the non-volatile configuration circuitry 407A, 407B, and 407C by circuit manufacturers at the mask level in the case of ROM, or by the user using standard device programmers in the case of PROM or EPROM. Flash and E$^2$-PROM can be programmed using on chip programming circuits.

The volatile configuration circuitry 406A, 406B, and 406C and non-volatile configuration circuitry 407A and 407C provide configuration bits that configure only I/O pin 400. Non-volatile circuitry 407B provides a global configuration bit, the data port bit, which configures all I/O pins associated with the eight-pin port containing I/O pin 400. In general, a particular configuration bit may configure one or more I/O pins.

I/O pin 400 connects to a tri-state buffer 401 and to an input select multiplexer 403. Tri-state buffer 401 acts as a buffer between an output select multiplexer 402 and I/O pin 400. When I/O pin 400 is configured to accept input signals, tri-state buffer 401 stops signals from output select multiplexer 402 from reaching I/O pin 400 and permits input signals to be routed through input select multiplexer 403. When I/O pin 400 is configured to send output signals, tri-state buffer 401 transmits signals from output select multiplexer 402 to I/O pin 400.

An output lead 408D from output control multiplexer 408 connects to an input lead of AND gate 409. Line 415 connects to a second input lead of AND gate 409, and an output lead from AND gate 409 connects to a control lead of tri-state buffer 401. When the signal on line 415 is high, multiplexer 408 controls whether I/O pin 400 is configured for input or output by selecting among three possible control signals, on line 408A a data read signal from a microcontroller, on line 408B a tri-state product-term signal from an on chip PAL unit, and on line 408C an output direction select bit from volatile configuration circuitry. When the signal on line 415 is low, output to I/O pin 400 is disabled. Disabling output signals may be necessary if I/O pin 400 is configured for input signals exclusively. For example, address latching enable (ALE), as discussed in regard to FIG. 5 below, is an input only signal from a microcontroller.

Two non-volatile configuration bits, PLD output select bit on line 416 and data port bit on line 417, are select signals for multiplexer 408 which select a control signal for tri-state buffer 401. When the PLD output select bit and the data port bit are both low, output multiplexer 408 selects the output direction signal on line 408C which is provided by volatile configuration circuit 406C. The microcontroller configures I/O pin 400 for output or input by writing a value to volatile configuration circuitry 406C. Software-executed by the microcontroller controls what is written to the volatile configuration circuitry and can change the volatile configuration many times during regular operation.

If either the data port bit on line 417 or the PLD output select bit on line 416 is high, the output direction signal is not selected and has no effect on buffer 401. The non-volatile configuration bits on lines 417 and 416 thereby override the volatile configuration. When the PLD output select bit on line 416 is high, the tri-state product-term signal on line 408B is selected, and a PLD macrocell controls the direction of data flow. When the data port bit is high, I/O pin 400 interfaces with a data bus 440, and the microcontroller data read signal on line 408A is selected to control data flow direction.

Volatile configuration bits on lines 418 and 419 and non-volatile configuration bits on select lines 416 and 417 are connected to select leads of output select multiplexer 402 and select leads of input select multiplexer 403. Values stored in volatile configuration circuitry 406A and 406B and non-volatile configuration circuitry 407A and 407B control routing of signal from any of the leads 421, 422, 423, 424 or 440 of output select multiplexer 402 to I/O pin 400 and control routing of a signal from I/O pins 400 to any of the leads 430, 432, 433, 434 or 440 of input select multiplexer 403. A user writes values to volatile control circuitry 406A and 406B during operation. In contrast, non-volatile configuration circuitry 407A and 407B are typically programmed using specialized equipment before an IC is put in operation.

In FIG. 4, a binary value represented by the four configuration bits on select lines 416, 417, 418, and 419 controls signal routing by output select multiplexer 402 and input select multiplexer 403. The PLD output select bit on line 416 and the data port bit on line 417 are non-volatile configuration bits. The bits on line 418 and 419 depend on volatile configuration bits. Table 1 shows a truth table identifying the four bit values used to select among output signals or inputs signals shown in FIG. 4. In Table 1, the binary values represented are the bits on lines 416, 417, 418, 419 in that order with the bit on line 416 being the most significant bit and the bit on line 419 being least significant bit, wherein "1" indicates that the bit is high, "0" indicates that the bit is low, and "x" indicates that the bit is irrelevant.

TABLE 1

| Binary Value | Signal and Line Selected |
| --- | --- |
| 0000 | Alternate Function In, line 430 |
| 0001 | Alternate Function Out, line 421 |
| 0010 | Latched Address, line 422 or Address Input, line 432 |
| 0011 | Register Out, line 423 or Status In, line 433 |
| 01xx | Data Bus, line 440 |
| 10xx | PLD Output, line 424 or PLD Input, line 434 |

As shown in Table 1 if either non-volatile configuration bit, the PLD output select bit on line 416 or data port bit on line 417, is set, the volatile configuration bits on lines 418 and 419 are irrelevant. The non-volatile configuration bits therefore override the volatile configuration bits. Further the volatile configuration bits on line 418 and 419 can not configure the port for accessing data bus 440, the PLD output signal on line 424, or the PLD input signal on line 434.

More generally, any number of bits may be used to select the input or output signal. The four bits used in FIG. 4, is one example. Also, two separate sets of bits, one for input and one for output may be used. Further, the truth table shown, Table 1, is just an example, and many other encoding schemes may be used. Other truth tables may permit selection of data bus 440 or PLD output line 424 using either volatile or non-volatile bits.

Further, routing of signals according to configuration data and encoding schemes can be implemented using combinations of logic gates. For example, a multiplexer can be constructed from AND gates and inverters, or as illustrated by AND gates 410 and 411 in FIG. 4, select signals can be partly handled by logic gates. A variety of multiplexer implementations will be apparent to those skilled in the art.

The signals, Latched Address on line 422, Register Output on line 423, Alternate Function Out on line 421, Address Input on line 432, Status Input on line 433, Alternate Function In on line 430, are known in the art, and I/O pin 400 is typically configured to handle these signals using volatile configuration bits, as shown in Table 1.

Data bus 440 connects to ROM, EPROM, SRAM, DRAM, and/or other embedded data storage units (not shown). The data storage units often store program code for use by the microcontroller. During start-up the microcontroller must have start-up, code before it can do anything useful, which means that if a port is configured to provide access to data storage which contains the start-up code, the port must be available during start-up. Otherwise, the microcontroller can not get the necessary code. In FIG. 4, ports are configured for access to data bus 440 by setting the non-volatile data port bit on line 417. Another reason for using a non-volatile configuration bit is that permitting software to disable a data bus can cause problems. For example, if software disables all data flow, the microcontroller runs out of code. The system behaves unpredictably and must be shut down and restarted.

Another functional unit provided access by the embodiment shown in FIG. 4 is a PAL unit having a PLD macrocell. PAL units and associate PLD macrocells are typically programmed to provide specific logic functions needed at start-up and thereafter. Setting the PLD output select bit on line 416 configures I/O pin 400 for access, available at start-up, to a PLD macrocell. The PLD macrocell can not erroneously be made inaccessible by software changes of volatile configuration bits because non-volatile configuration bits take precedence over volatile configuration bits.

PAL units and memory units are examples of functional units where non-volatile configuration is particularly important. Non-volatile configuration circuitry can be used to configure ports for other functional units which need to be accessible at start-up or which should not be changed by a microcontroller. An advantage of providing both volatile configuration circuitry 406A, 406B, and 406C and non-volatile configuration circuitry 407A, 407B, and 407C is that a single configurable port provides the option of configuration using software programmable volatile configuration bits or non-volatile configuration bits that provide configuration at start-up and prevent software error. The variety of configurations available assures efficient utilization of functional units and I/O pins.

Another goal of configurable ports is efficient use of non-volatile circuitry to minimize wafer area needed to fabricate a port. One way to minimize the area is to provide non-volatile circuitry that has multiple uses instead of supplying separate non-volatile circuitry for each configuration need. FIG. 5 shows a circuit diagram of a PLD macrocell according to an embodiment of this invention which illustrates how configuration circuitry can be reused or recycled.

The circuit shown in FIG. 5 may be used with the circuit shown in FIG. 4. To do so, line 515 is connected to line 415 and provides a non-volatile configuration bit on line 415, output line 524 connects to PLD output line 424, and input line 534 connects to PLD input line 434. Line 416 is connected to line 516 so that the same non-volatile configuration bit, the PLD output select bit, is provided on both lines 416 and 516.

In FIG. 5, OR gate 510 ORs product terms from a set of AND gates and a programmable array (not shown). The output lead from OR gate 510 is connected to an input lead of EXOR gate 511. A polarity select bit, provided by non-volatile circuitry 507C to a second input lead of EXOR gate 511, determines whether the output signal from OR gate 510 is inverted or not. When the polarity select bit is high the output signal from OR gate 510 is inverted by EXOR gate 511. When the polarity select bit is low the output signal is not inverted.

Another configurable feature of the PLD macrocell is whether the output signal on output line 524 is registered or combinatorial. An output lead from EXOR gate 511 is connected to an input lead of a multiplexer 512 and to an input lead of a flip-flop 513. Flip-flop 513 is clocked so that the output signal from flip-flop 513 is registered by a global clock signal on lead 514. An output lead from flip-flop 513 connects to a second input lead of multiplexer 512. A registered cell bit provided by non-volatile configuration circuitry 507B is provided on a select lead of multiplexer 512 and selects as output signal on output line 524 either the registered output signal from flip-flop 513 or the combinatorial output signal from EXOR gate 511.

The input signal on line 534 from the peripheral port or internal feedback from output line 524 may be assert to the programmable array through line 520. Connected to input leads of a multiplexer 517 is output line 524 and input line 534. Non-volatile configuration circuitry 507A connects to a select lead of multiplexer 517 and provides a PLD input select bit which selects the signal provided to line 520. The PLD input select bit, the registered cell bit, and the polarity select bit are all non-volatile bits provided by non-volatile configuration circuitry 507A, 507B, and 507C respectively.

The polarity select bit, the PLD input select bit, the PLD output select bit, and the registered cell bit control the operation of the PLD macrocell. However, if the PLD macrocell is not used, non-volatile circuitry 407A, 507A, 507B, and 507C, which provide non-volatile configuration bits, are not needed by the PLD macrocell. In FIG. 5, NAND gate 518 reuses or "recycles" non-volatile circuitry 507B to provide a signal on line 515 which enables or disables alternate input functions such as address latching. This reduces the total number of non-volatile bits provided and reduces the wafer area used for non-volatile configuration circuitry.

As discussed above, some microcontrollers use a time multiplexed address/data bus that carries both address and data. Such microcontrollers commonly produce an ALE signal to indicate when an address is on the bus. Some devices needed for use with a microcontroller can not interpret the ALE signal and require separate address and data busses. A configurable peripheral may provide an interface between a microcontroller with a time multiplexed address/data bus and a device that requires a separate address bus, by latching address signals from the microcontroller. The latched address can be provided on configurable peripheral port pins and also used for embedded memories in the configurable peripheral.

For address latching, an I/O pin must be configured to accept the ALE signal from the microcontroller, and the configurable peripheral must enable latching circuitry. The configuration and the enabling of latching circuitry should be non-volatile to make latched address available at start-up.

NAND gate 518 has a first input lead connected to non-volatile circuitry 507B, a second input lead connected to an inverter 519 which inverts the PLD output select bit, and a third input connected to non-volatile circuitry 507A which provides the PLD input select bit. When the output signal on line 524 is used, either an I/O pin is configured for output from a PLD macrocell, and the PLD output select bit is high, or the output signal is used for an embedded feedback application, and the PLD input select bit is low. In either case the output signal from NAND gate 518 is high, and the registered cell bit controls whether the PLD macrocell output signal is registered or combinatorial. Referring to FIG. 4, the signal on line 415 is high, which permits signals to pass through AND gates 409, 410, and 411, and I/O pin 400 operates as described above.

Referring again to FIG. 5, when the PLD macrocell output signal is not used, not output nor fed back, the PLD macrocell may still be used to route an input signal into the PAL unit, but the registered cell bit is not needed to control operation of the PLD macrocell. The registered cell bit may be used for a second purpose. The unused PLD macrocell output signal is indicated by the PLD output select bit being low and the PLD input select bit being high.

When the PLD input select bit is high and the PLD output select bit is low, NAND 518 inverts the registered cell bit. Setting the registered cell bit high enables address latching by causing the signal on line 515 to be low. In FIG. 4, the signal on line 415 is forced low, and AND gates 409, 410, and 411 shut off. AND gate 409 turns off output signals from tri-state buffer 401, so that I/O pin 400 may only be used for input. Output signals from AND gates 410 and 411 are low, and therefore override, volatile configuration bits on lines 418 and 419. The Alternate function In signal on line 430 is selected by input select multiplexer 403 unless one of the other non-volatile bits is set. Resetting the registered cell bit low turns on AND gates 409, 410, and 411 and makes I/O pin 400 software programmable.

The embodiment of FIG. 5, which recycles unused PLD macrocell bits for a non-volatile enable bit, is only one example of recycling of non-volatile bits. Similarly, enabling ALE is just one example of purposes for a recycled bit. Other examples include control of address transition detection (ATD) logic and byte high enable (BHE), but many uses and reuses of non-volatile configuration bits will be apparent to those skilled in the art. Recycling non-volatile configuration bits saves silicon area by reducing the amount of non-volatile circuitry that must be provided and therefore makes a configurable port cheaper to manufacture.

Although several embodiments of the present invention have been described in detail, the description is only an illustration and is not limiting. Other embodiments of this invention will be obvious in view of the above description.

We claim:

1. An integrated circuit including a peripheral port, the peripheral port comprising:

an input/output pin;
a multiplexer coupled to the input/output pin;
a structure for providing one or more volatile configuration bits; and
a structure for providing one or more non-volatile configuration bits, wherein the volatile configuration bits and the non-volatile configuration bits are asserted to select terminals of the multiplexer and control routing of signals through the multiplexer from or to the input/output pin, and one or more of the non-volatile configuration bits overrides one or more of the volatile configuration bits.

2. The integrated circuit of claim 1 wherein:

when the non-volatile configuration bits have a first value, the volatile configuration bits control routing of signals through the multiplexer; and when the non-volatile configuration bits have a second value, the volatile configuration bits have no effect on the multiplexer.

3. The integrated circuit of claim 2, further comprising:

a memory; and
a data line connecting the memory to the multiplexer, wherein, when the non-volatile configuration bits have the second value, the non-volatile configuration bits control the multiplexer by causing the multiplexer to route a signal between the memory and the input/output pin.

4. The integrated circuit of claim 2, further comprising:

a programmable array logic unit; and
a macrocell connecting to the programmable array logic and to the multiplexer, wherein when the non-volatile configuration bits have the second value, the non-volatile configuration bits control the multiplexer by causing the multiplexer to route a signal between the macrocell and the input/output pin.

5. An integrated circuit including a peripheral port, comprising:

an input/output pin;
a multiplexer coupled to the input/output pin;
a structure for providing one or more volatile configuration bits;
a structure for providing one or more non-volatile configuration bits, wherein the volatile configuration bits and the non-volatile configuration bits control the multiplexer and one or more of the non-volatile configuration bits overrides one or more of the volatile configuration bits;

a functional unit connected to the multiplexer and to the structure for providing non-volatile configuration bits, the structure for providing non-volatile configuration bits providing a particular non-volatile configuration bit which is usable to control operation of the functional unit; and a circuit which detects when the particular non-volatile configuration bit is used to control operation of the functional unit and which provides the particular non-volatile configuration bit for control of the multiplexer when the particular non-volatile configuration bit is not used to control the operation of the functional unit.

6. The integrated circuit of claim 5, wherein:

the functional unit includes a programmable array logic unit and a macrocell, the macrocell being connected to the multiplexer; and the particular non-volatile bit is used to control the operation of the macrocell when the macrocell is used, and is usable to control the multiplexer when the macrocell is not used.

7. The integrated circuit of claim 1, wherein:

the peripheral port further comprises a second multiplexer coupled to the input/output pin;

the first multiplexer routes output signals to the input/output pin; and the second multiplexer routes input signals from the input/output pin.

8. The integrated circuit of claim 7, wherein the volatile configuration bits and the non-volatile configuration bits control routing of signals through the second multiplexer.

9. The integrated circuit of claim 7, wherein the volatile configuration bits and the non-volatile configuration bits that control the first multiplexer also control the second multiplexer.

10. An integrated circuit including a peripheral port, comprising:

an input/output pin;

a multiplexer coupled to the input/output pin;

a structure for providing one or more volatile configuration bits;

a structure for providing one or more non-volatile configuration bits;

a first plurality of functional units, each functional unit in the first plurality of functional units being coupled to the multiplexer; and a second plurality of functional units, each of the functional units in the second plurality of functional units being connected to the multiplexer;

wherein the volatile configuration bits and the non-volatile configuration bits control the multiplexer and one or more of the non-volatile configuration bits overrides one or more of the volatile configuration bits such that:

when the non-volatile configuration bits have a first value, the volatile configuration bits control the multiplexer by causing the multiplexer to route a signal between the input/output pin and a selected functional unit in the first plurality of functional units; and when the non-volatile configuration bits have a value other than the first value, the volatile configuration bits have no effect on the multiplexer and the non-volatile configuration bits control the multiplexer by causing the multiplexer to route a signal between the input/output pin and a functional unit in the second plurality of functional units.

* * * * *